(12) United States Patent
Moore et al.

(10) Patent No.: US 7,685,323 B1
(45) Date of Patent: Mar. 23, 2010

(54) AUTOMATIC CONFIGURATION OF DEVICES IN A NETWORK

(75) Inventors: David A. Moore, Tomball, TX (US); Tuong Q. Tran, Houston, TX (US); Hoang Thanh Nguyen, Houston, TX (US); Allen T. Morrison, Tomball, TX (US); Royal H. King, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 255 days.

(21) Appl. No.: 11/830,954

(22) Filed: Jul. 31, 2007

(51) Int. Cl.
*G06F 3/00* (2006.01)
*G06F 13/00* (2006.01)
*G06F 15/177* (2006.01)

(52) U.S. Cl. .............................. 710/8; 710/15; 710/17; 710/104; 709/220; 717/171

(58) Field of Classification Search .................. None
See application file for complete search history.

(56) References Cited

U.S. PATENT DOCUMENTS

| | | | |
|---|---|---|---|
| 6,509,830 B1 * | 1/2003 | Elliott | 340/286.02 |
| 7,379,778 B2 * | 5/2008 | Hayes et al. | 700/66 |
| 2004/0210630 A1 * | 10/2004 | Simonnet et al. | 709/203 |
| 2005/0043907 A1 * | 2/2005 | Eckel et al. | 702/62 |
| 2005/0286220 A1 * | 12/2005 | Moore et al. | 361/687 |

* cited by examiner

*Primary Examiner*—Henry W. H. Tsai
*Assistant Examiner*—Michael Sun

(57) ABSTRACT

A method for automating configuration of devices in a network having a network bus for communicating with the devices, wherein the network is implemented in a physical environment the method comprising detecting a device assembly that is connected to the network bus, wherein the device assembly includes a plurality of devices assembled thereon in a predetermined physical order; upon detecting a device assembly connected to the network bus, determining whether the detected device assembly is of a predetermined first type; upon determining that the detected device assembly is of the first type, reading data from the plurality of devices assembled thereon in an order corresponding to the predetermined physical order of the plurality of devices as assembled on the device assembly; and identifying a physical location in the physical environment of each of the plurality of devices on the first-type device assembly based on the order in which data of the plurality of devices is read from the first-type device assembly.

20 Claims, 4 Drawing Sheets

AUTOMATIC CONFIGURATION OF DEVICES IN A NETWORK

BACKGROUND

A data center may be defined as a location, for example, a room that houses equipment such as computer systems arranged in a number of racks. A standard rack, for example, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Efficient environmental control of a data center requires detailed knowledge of environmental conditions through the data center. Thus, sensors are typically positioned throughout the data center to detect temperature, pressure, humidity, or mass flow rates of air. In order to detect these conditions with a relatively high degree of granularity, large numbers of sensors are required to be placed throughout the data center. The sensors are typically configured to transmit detected condition information to a particular computing or monitoring device that acts as a data center controller to control environmental actuators for the data center. For example, the controller is used to control computer room air conditioning (CRAC) units that operate to deliver cool air to the data center to keep computer systems therein from overheating.

Because of the relatively large number of sensors typically employed in a data center, the data center controller must be configured to provide association between the sensor readings and the sensor position. Also, in a dynamic environment of the data center, where equipment is added to or removed from the data center to accommodate dynamic information technology (IT) needs, associated sensors also must be added to or removed from the data center. Thus, there is a need to track the addition and removal of sensors in the data center so as to configure the sensors accordingly before they are used by the data collection system.

Conventionally, sensor configuration tasks are typically handled by one of two methods, local hardware configuration or table-based remote software configuration. Both of these methods are labor intensive and error prone. In local hardware configuration, sensor identifying information is set by a physical switch or by manipulation of the register setting on the sensor to provide sufficient sensor configuration details for proper assembly. This requires a trained sensor installer with detailed knowledge of settings and global installation design. This method also requires hardware switches or programmable memory and programming devices for each setting change. In table-based remote software configuration, a remote database is used to track configuration parameters. Settings are often manually determined and input into the database. This method requires real time cooperation between the sensor installer and the database maintainer.

It would be beneficial to more efficiently configure sensors as they are added to or removed from a network.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

Described herein are systems and methods for automatic configuration of sensors in a sensor network to provide such sensors with hot-plug compatibility for plug-and-play attachment to the sensor network without the need to cease operation of the sensor network in order and/or to manually reconfigure the sensor network to account for the addition or removal of the sensors from the sensor network.

Figure 1:
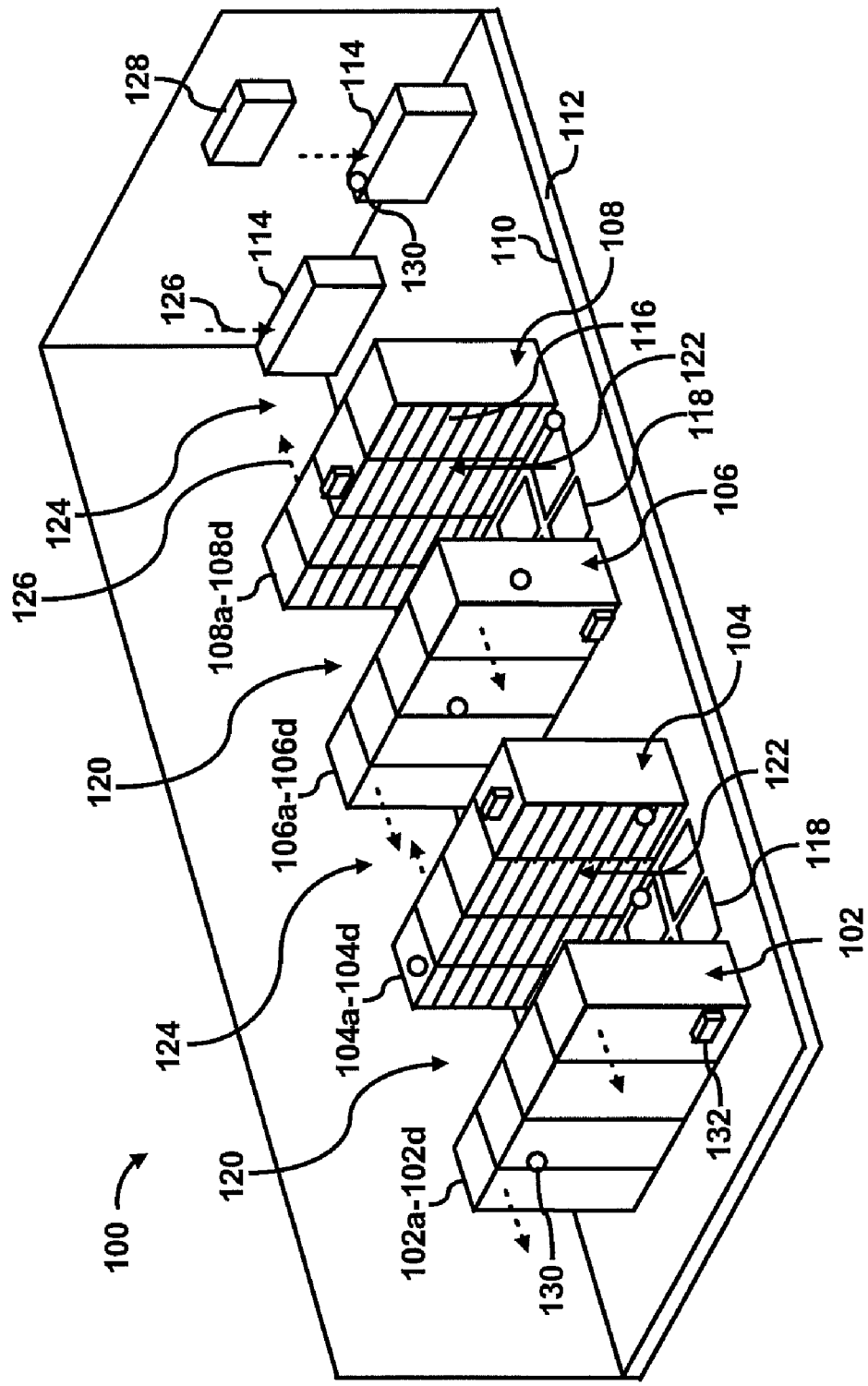
FIG. 1 illustrates a simplified perspective view of a data center, according to an embodiment.

FIG. 1 illustrates a simplified perspective view of a data center 100 which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the data center 100 depicted in FIG. 1 represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102-108, for example, electronics cabinets, aligned in parallel rows. Each of the rows of racks 102-108 is shown as containing four racks (a-d) positioned on a raised floor 110. A plurality of wires and communication lines (not shown) may be located in a space 112 beneath the raised floor 110. The space 112 may also function as a plenum for delivery of cooled air from one or more computer room air conditioning (CRAC) units 114 to the racks 102-108. The cooled air may be delivered from the space 112 to the racks 102-108 through vent tiles 118 located between some or all of the racks 102-

108. The vent tiles 118 are shown as being located between racks 102 and 104 and 106 and 108.

As previously described, the CRAC units 114 generally operate to supply cooled air into the space 112. The cooled air contained in the space 112 may include cooled air supplied by one or more CRAC units 114. Thus, characteristics of the cooled air, such as, temperature, pressure, flow rate, etc., may substantially be affected by one or more of the CRAC units 114. By way of example, the cooled air supplied by one CRAC unit 114 may mix with cooled air supplied by another CRAC unit 114.

The racks 102-108 are generally configured to house a plurality of components 116 capable of generating/dissipating heat (not shown), for example, processors, micro-controllers, high-speed video cards, memories, semi-conductor devices, and the like. The components 116 may be elements of a plurality of subsystems (not shown), for example, computers, servers, bladed servers, etc. The subsystems and the components may be operated to perform various electronic functions, for example, computing, switching, routing, displaying, and the like. In the performance of these electronic functions, the components, and therefore the subsystems, may generally dissipate relatively large amounts of heat.

The areas between the racks 102 and 104 and between the racks 106 and 108 may comprise cool aisles 120. These aisles are considered "cool aisles" because they are configured to receive cooled airflow from the vent tiles 118, as generally indicated by the arrows 122. In addition, the racks 102-108 generally receive cooled air from the cool aisles 120. The aisles between the racks 104 and 106, and on the rear sides of racks 102 and 108, are considered hot aisles 124. These aisles are considered "hot aisles" because they are positioned to receive air that has been heated by the components 116 in the racks 102-108, as indicated by the arrows 126.

The sides of the racks 102-108 that face the cool aisles 120 may be considered as the fronts of the racks and the sides of the racks 102-108 that face away from the cool aisles 120 may be considered as the rears of the racks 102-108. For purposes of simplicity and not of limitation, this nomenclature will be relied upon throughout the present disclosure to describe the various sides of the racks 102-108.

The CRAC units 114 generally operate to cool received heated air as indicated by the arrows 126. In addition, the CRAG units 114 may supply the racks 102-108 with airflow that has been cooled, through any reasonably suitable known manners and may thus comprise widely available, conventional CRAC units 114. For example, the CRAC units 114 may comprise vapor-compression type air conditioning units, chiller type air conditioning units, etc. Examples of suitable CRAC units 114 may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1 is a computing device 128 configured to control various operations of the data center 100. The computing device 128 may be configured, for example, as a central data collector and controller to control CRAC units 114 and the vent tiles 118 to thereby vary at least one of a direction and a volume flow rate of cooled airflow delivered through the vent tiles 118. In one regard, the computing device 128 may control the CRACs 114 to change the air conditioning and fan settings thereof from minimum to maximum. In another regard, the computing device 128 also may control the vent tiles 118 to move from fully closed positions to fully open positions. In determining manners in which the vent tiles 118 may be manipulated, the computing device 128 may receive temperature information from a plurality of sensor plug in assemblies (PIAs) 130 positioned at various locations throughout the data center 100, as will be described in greater detail hereinbelow.

In one example, each PIA 130 is a 1-Wire® device. As designed by Maxim Integrated Products (formerly Dallas Semiconductor) of Sunnyvale, Calif., and understood in the art, a 1-Wire® device and 1-Wire® communications in general use a two-conductor signaling interface, with one conductor providing a ground reference and the other covers both signaling and power roles. Each PIA 130 is of a modular design that may be installed on or removed from each rack and includes a plurality of sensors built into the assembly and spaced apart from one another so that each can detect a condition at a different location of the rack. For example, a PIA 130 may include 5 sensors spaced evenly along the height of a rack 102. The sensors may be configured to detect various conditions in the data center 100. For example, the sensors may be configured to detect temperature, humidity, airflow direction, airflow magnitude, pressure, positions of movable objects (e.g., rack door status), etc. A PIA 130 also may include actuators, or a combination of sensors and actuators.

Aside from the sensors and/or actuators, each PIA 130 also includes a configuration memory built into the assembly for storing information identifying the PIA 130 and configuration information of devices (sensors and/or actuators) built onto the PIA 130. In one example, the configuration memory may be a semiconductor memory device such as a ROM (read only memory), EPROM (erasable, programmable ROM), EEPROM (electrically erasable, programmable ROM), or any other suitable memory devices, including electronic, optical, magnetic, or other data storage devices capable of providing a processor or processing unit with computer-readable instructions. Optionally, a PIA 130 may further include simple LED (light emitted diode) status indicator outputs.

The configuration memory of each PIA 130 also stores an index or mapping table, as shown in Table 1, to provide locations of particular information (explained in the table) that is stored in the configuration memory. As shown in Table 1, each PIA 130 has a globally unique 64-bit memory address value (PIA_Addr) that can be selected individually for communication even when connected in parallel with other 1-Wire® devices, such as when connected in parallel with other PIAs 130 to a base station 132 as further described later. The 64-bit address value includes an 8-bit family code, a 48-bit unique address, and an 8-bit CRC (cyclic redundancy check) checksum for data error detection. This address is programmed during the die production process for the configuration memory in which the address is stored and cannot be changed. Thus, it is possible identify the PIA 130 from this 64-bit address value. As also shown in Table 1, the configuration memory in each PIA 130 also stores 64-bit addresses of those devices (e.g., sensors and actuators) that are built on the assembly. For example, the configuration memory includes the addresses of the sensors 230 (Sensor1_Addr, Sensor2_Addr, . . . , SensorN_Addr) stored in the order that they appear on the assembly. Thus, this information provides to a corresponding base station 132 a physical location of each sensor on the assembly of the PIA 130, and thus at a physical location on the rack on which the PIA 130 is used.

In some instances, it is desirable to place multiple PIAs on one data center equipment rack to read conditions at different locations of the rack. For example, when both the inlet and outlet temperatures of a rack are desired, one PIA may be placed at the front of the rack and another may be placed at the back of the rack. In such an instance, the PIAs and sensors thereon must be identified to the base station and associated with either front or rear locations. This issue is also solved by the configuration information, wherein PIAs for front installation may have separate and distinct part numbers PIA_PartNum from those PIAs for rear installation.

TABLE 1

| Field Name | Contents | Comments | Len (Bytes) |
|---|---|---|---|
| Block_Length | Memory offset of the last byte (checksum byte) in this table | The actual number of bytes (actual table length) = Block Length + 1 | 2 |
| Table_Version | This table versioning (possible values 00-FF) | Allow different table formats to be supported at later time | 1 |
| PIA_Type | PIA part type | Numerical representation of part number (normal types = 1-255, type 0 is special reserved type). Identifies PIA type and characteristics to base station. Also may imply intended installation location of PIA (e.g.: differentiate between front and rear installation) | 1 |
| PIA_PartNum | PIA manufacturer part number | PIA unique part number. This data is passed to the central data collector for human readable identification of the type of PIA installed. | 13 |
| PIA_Serial | PIA serial number | Serial number of PIA | 16 |
| PIA_HWRev | PIA hardware revision | Particular revision of the PIA to indicate changes in PIA hardware configurations | 1 |
| PIA_Addr (PK) | 1-Wire ® 64-bit address of the EEPROM resides on this PIA | Unique PIA identifier on the 1-Wire ® bus - This is the primary key for PIAs instance in the database | 8 |
| PIA_ParmLen | Length in bytes of the following PIA-specific parameter list | A value of 0 in length indicates empty parm list (i.e., PIA_Parms field should be omitted) This construct allows for expansion of the table to include unanticipated values required for future types of PIAs | 1 |
| PIA_Parms | PIA specific parameter list | Optional parameters (if any) | 0-N |
| SensorCount (sensor or any other PIA device) | Total number of sensor devices on this PIA | This is followed by a list of 64-bit sensor addresses. This value is always > 0 | 1 |
| Sensor1_Addr | 64-bit device address of 1st sensor device | Devices in physical order | 8 |
| Sensor2_Addr | . . . | . . . | 8 |
| SensorN_Addr | . . . | . . . | 8 |
| Checksum | Table checksum - See below for details on checksum calculation | For manufacturing verification and B/S (base station) to verify after reading in the table | 1 |

The PIAs 130 may be in communication with respective base stations 132, which are configured to communicate the detected condition information to a data center controller. For example, the PIAs 130 for each of the rows 102-108 are in communication with the base station 132 that is attached to the respective row. As will be described in greater detail hereinbelow, the base stations 132 are generally configured to obtain detected condition information from sensors 230 on the PIAs 130 and to transmit the information to a central data collector or controller, such as the computing device 128, or over a network such as the Internet or an intranet to a remote central data collector or controller.

The locations of the PIAs 130 and the base stations 132 in FIG. 1 are for representative purposes only and are not intended to limit the data center 100 in any respect. Therefore, the sensors 130 and the sensor platforms 132 may be positioned at any reasonably suitable locations in the data center 100. The data center 100 is also illustrated in FIG. 1 as containing four rows of racks 102-108 and two CRAC units 114 for purposes of simplicity of illustration. Thus, the data center 100 should not be limited in any respect based upon the number of racks 102-108 and CRAC units 114 illustrated in FIG. 1. In addition, although the racks 102-108 have all been illustrated similarly, the racks 102-108 may comprise heterogeneous configurations. For example, the racks 102-108 may be manufactured by different companies or the racks 102-108 may be designed to house differing types of components 116, for example, horizontally mounted servers, bladed servers, etc.

Figure 2:
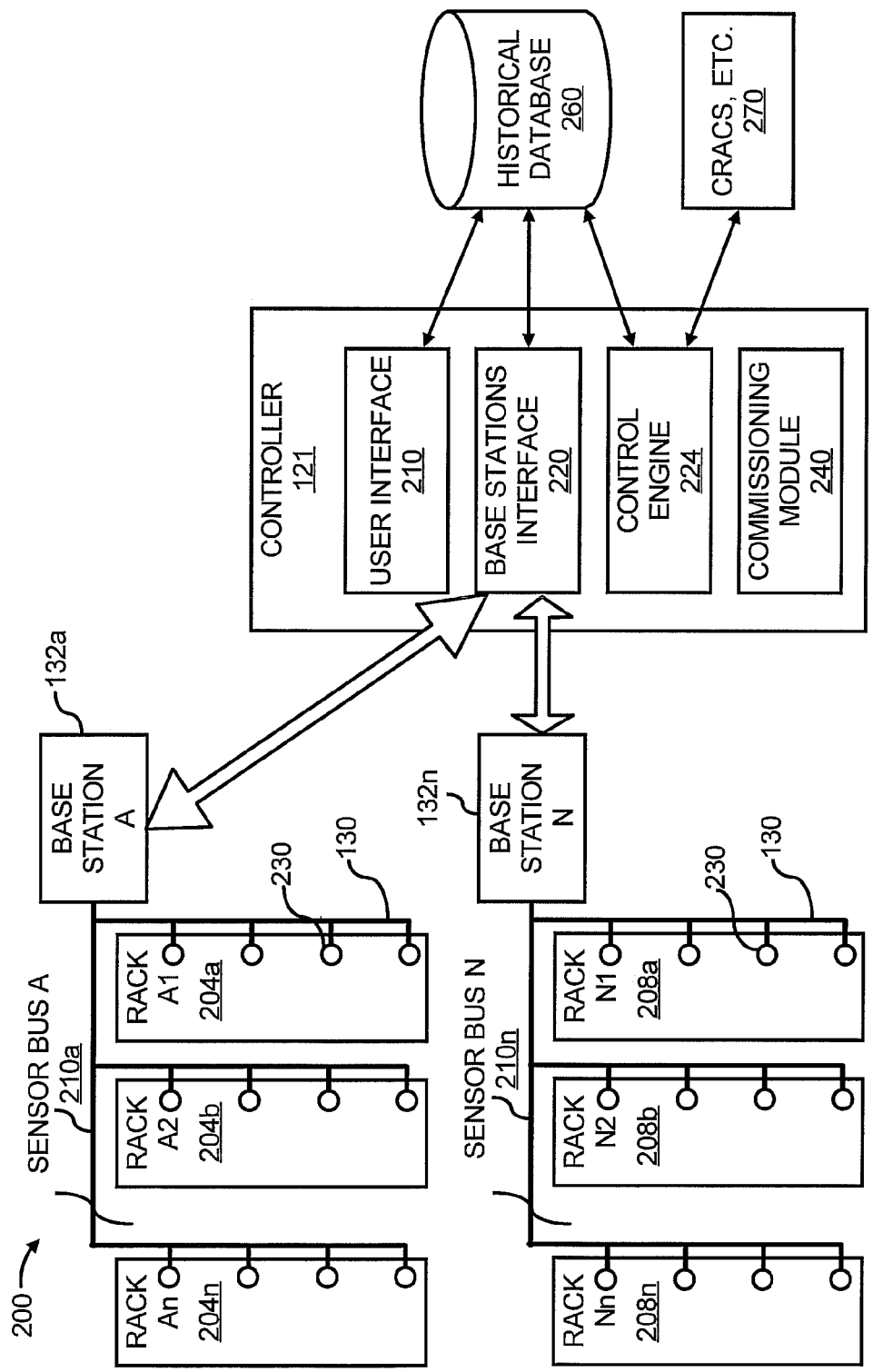
FIG. 2 illustrates a diagram of a sensor network in the data center depicted in FIG. 1, according to an embodiment.

FIG. 2 is a diagram 200 of a sensor network in the data center 100, according to an example of the data center 100. It should be understood that the following description of the diagram 200 is but one manner of a variety of different manners in which such a diagram 200 may be configured. In addition, it should be understood that the diagram 200 may include additional components and that some of the components described may be removed and/or modified without departing from a scope of the diagram 200. In the following description of FIG. 2, the designations "n" and "N" generally denote any reasonably suitable whole number.

As shown, the PIAs 130 are positioned at various locations of the data center 100. Only two of the PIAs 130 are labeled for simplicity purposes. It should, however, be understood that similarly illustrated elements also comprise PIAs 130. As noted earlier, each PIA 130 may include an assembly of spaced-apart sensors 230 configured to detect one or more conditions. Also for simplicity purposes, only four sensors 230 are shown per each PIA 130. However, it should be understood that any desired number of sensors 230 may be built into a PIA, and the number may be based on the size of rack (or environment to be measured) so that conditions on such a rack may be adequately detected. By way of example, the sensors 230 may comprise devices for detecting at least one environmental condition, for example, temperature detectors (for example, thermistors, thermometers, thermocouples, etc.), anemometers, humidity detectors, pressure detectors, etc., or combinations thereof.

As another example, the sensors 230 may comprise devices for detecting relative positions of various apparatuses, for example, door position detectors, encoders, etc. As a further example, the sensors 230 may comprise devices configured to detect the power drawn by one or more components in the data center 100. In addition, the types of sensors 230 deployed on each PIA 130 may be the same or differ from one another, such that, a temperature detector may be positioned on the same PIA with another temperature detector or with a humidity detector.

The PTAs 130 are illustrated as being housed in or around respective racks A1-An, B1-Bn, and N1-Nn (204a-204n, 206a-206n, and 208a-208n, hereinafter (204a . . . 208n)). Thus, for example, the PIAs 130 may be positioned and configured to detect one or more conditions at variously located racks 204a . . . 208n as well as within or around the variously located racks 204a . . . 208n. As another example, one or more of the sensors 130 may be positioned to detect conditions around vent tiles 118, return vent tiles (not shown), CRAC units 114, etc.

The racks 204a-204n labeled as A1 ... An may comprise racks situated in a particular row of racks. In addition, or alternatively, the racks 204a-204n may comprise racks that are situated in different rows or in various clusters.

The PIAs 130 may be positioned based upon the one or more conditions their sensors 230 thereon are configured to detect. For example, if PIAs 130 are configured to detect the temperature of the airflow at an inlet and an outlet of a rack 204a, a PIA 130 may be positioned at the front of the rack 204a, and another PIA 130 may be positioned at the back of the rack 204a to detect the temperature of the airflow at an outlet of the rack 204a. In a second example, if a PIA 130 is configured to detect the position of a front door of the rack 204a, a PIA 130 may be appropriately placed to detect the door position. Thus, only one PIA 130 is used per rack for this second example. In general, many examples are contemplated wherein one or multiple PIAs 130 may be employed per rack or equipment.

The PIAs 130 communicate with respective base stations A-N 132a-132n over respective sensor buses A-N 210a-210n. The sensor buses 210a-210n may comprise wires or communications buses configured to enable one or both of data transmission from and power supply to the PIAs 130. Because PIAs 130 are of modular design, they may be connected to or removed from any of the sensor buses 210a-n. In one example, the sensor buses 210a-210n are 1-Wire® data buses configured to enable both data transmission from and power supply to the PIAs 130, which are also 1-Wire® devices as noted earlier. Each base station is operable to communicate with one or more PIAs 130 over the 1-Wire® data buses 210a-n. For example, as illustrated in FIGS. 1-2, each of the base stations 132 in a row (102-108) operates to communicate with the PIAs 130 that are in such a row. In one example, each base station is a microcontroller-based electronics assembly capable of communication, as illustrated, with a central data collector or controller, such as the computing device 128, over a direct or network link, such as an Ethernet link. In one example, an applicable microcontroller may be a processing element such as an application specific integrated circuit (ASIC) or a general-purpose computer processor. Each base station is also capable of communication with associated PIAs over a sensor bus 210a, such as a 1-Wire® bus discussed earlier.

In one example, a primary purpose of the base station is to periodically detect or discover the PIAs that are connected to the base station via a 1-Wire® bus, read the attached sensor (or actuator) devices 230 on the "discovered" PIAs over the 1-Wire® bus, and transmit the sensor data over a network link to a computing device 128 for use in data center environmental control. The sensor data is useful because during the PIA discovery process, the base station already provided a correspondence between readings from the sensors 230 and the physical location of the sensors on the data center equipment rack, as based on a reading of configuration information stored in the configuration memory of each PIA. Such configuration information is read into a memory buffer on the base station and combined with a subsequent reading of the sensor data into a data packet for transmission to the computing device 128. Furthermore, any addition or removal of a PIA to the 1-Wire® bus is detectable by the base station along with the location in the data center for such an addition/removal based on the addition/removal of a PIA connection on the 1-Wire® bus.

FIG. 2 illustrates the computing device 128 as a data center controller that includes a user interface 210, a base station interface 220, a control engine 224, and a commissioning module 240. The user interface 210 may include one or more input devices, such as a keyboard, a mouse, a stylus, and the like. It may also include one or more output devices, such as a display, to provide information about the data center and its environmental control to the user. The base stations interface 220 includes connections, such as Ethernet ports, for communication with base stations over a direct or network link, such as an Ethernet link, to control the base stations 132a-n and receive sensor data packets with properly identified correspondence between the sensor physical location and the sensor data. The sensor data packets are formed into valid records and sent to historical database 260 for storage.

The control engine 224 is operable to execute desired control algorithms to control actuators 270 such as CRACs, controllable vent tiles, etc. so as to provide adjustments to the data center environment in response to the read sensor data and desired user inputs for such an environment. The commissioning module 240 is operable to perform a commissioning process to correlate the sensors on the PIAs 130 with the actuators 270. This correlation generally provide indications of how the sensors of a sensor network may be affected by variations in the outputs of the actuators. An example of a commissioning process suitable for correlating the actuators and the sensors is disclosed in a co-pending and commonly assigned U.S. patent application as identified from its U.S. Patent Application Publication No. 20060206291, entitled "COMMISIONING OF SENSORS."

Figure 3:
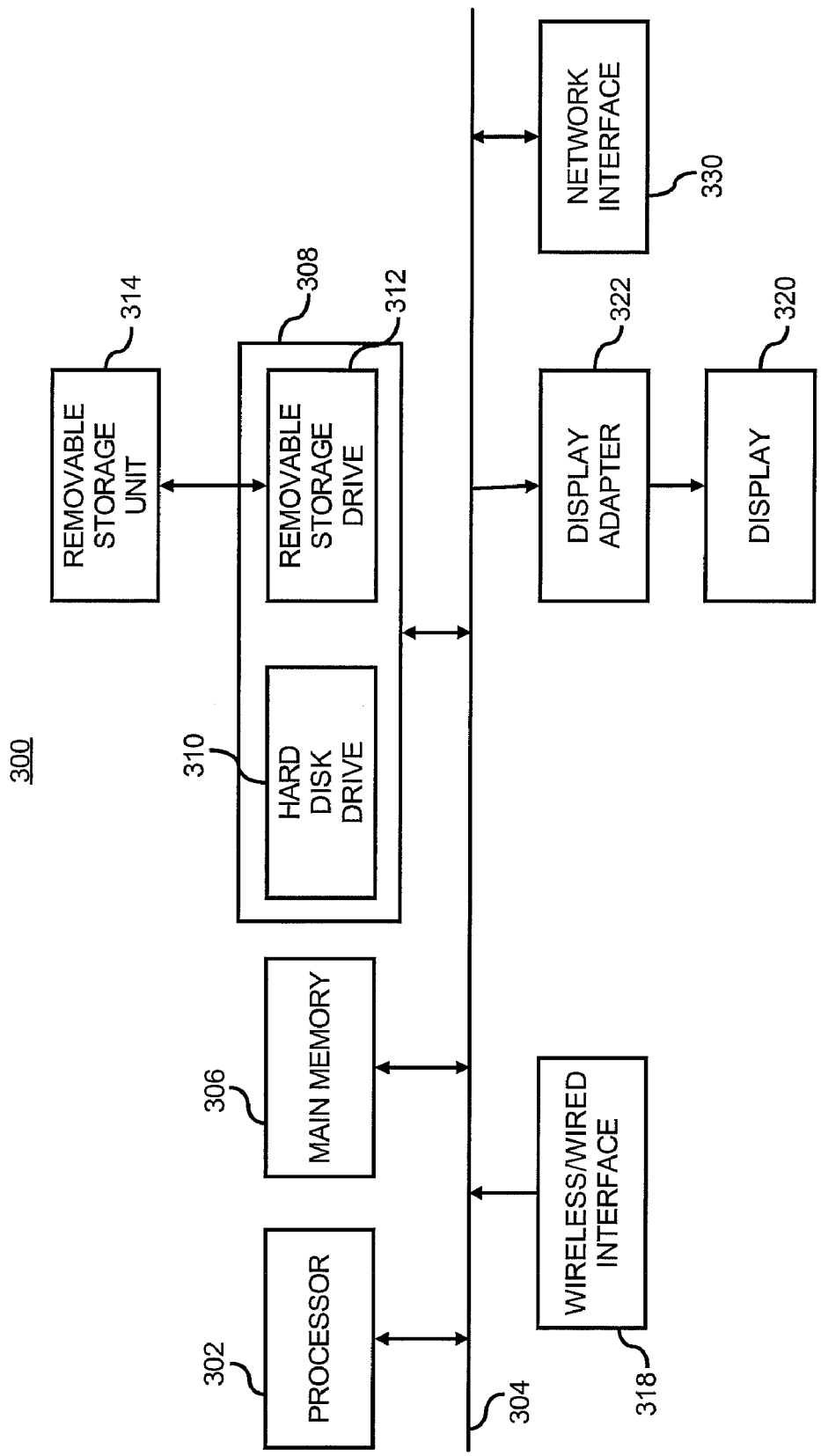
FIG. 3 illustrates a computerized system that is operable as a platform to implement a data center controller, according to one embodiment.

FIG. 3 illustrates a block diagram of a computerized system 300 that is operable to be used as a platform for implementing the computing engine 128.

The computer system 300 includes one or more processors, such as processor 302, providing an execution platform for executing software. Thus, the computerized system 300 includes one or more single-core or multi-core processors of any of a number of computer processors, such as processors from Intel, AMD, and Cyrix. As referred herein, a computer processor may be a general-purpose processor, such as a central processing unit (CPU) or any other multi-purpose processor or microprocessor. A computer processor also may be a special-purpose processor, such as a graphics processing unit (GPU), an audio processor, a digital signal processor, or another processor dedicated for one or more processing purposes. Commands and data from the processor 302 are communicated over a communication bus 304 or through point-to-point links with other components in the computer system 300.

The computer system 300 also includes a main memory 306 where software is resident during runtime, and a secondary memory 308. The secondary memory 308 may also be a computer-readable medium (CRM) that may be used to store software programs, applications, or modules for control algorithms in the control engine 224 and for the commissioning module 240. The main memory 306 and secondary memory 308 (and an optional removable storage unit 314) each includes, for example, a hard disk drive and/or a removable storage drive 312 representing a floppy diskette drive, a magnetic tape drive, a compact disk drive, etc., or a nonvolatile memory where a copy of the software is stored. In one example, the secondary memory 308 also includes ROM (read only memory), EPROM (erasable, programmable ROM), EEPROM (electrically erasable, programmable ROM), or any other electronic, optical, magnetic, or other storage or transmission device capable of providing a processor or processing unit with computer-readable instructions.

The computer system 300 includes a display 320 connected via a display adapter 322, user interfaces comprising one or more input devices 318, such as a keyboard, a mouse, a stylus, and the like. A network interface 330 is provided for communicating with other computer systems via, for example, a network, and may include the base stations interface 220.

Figure 4:
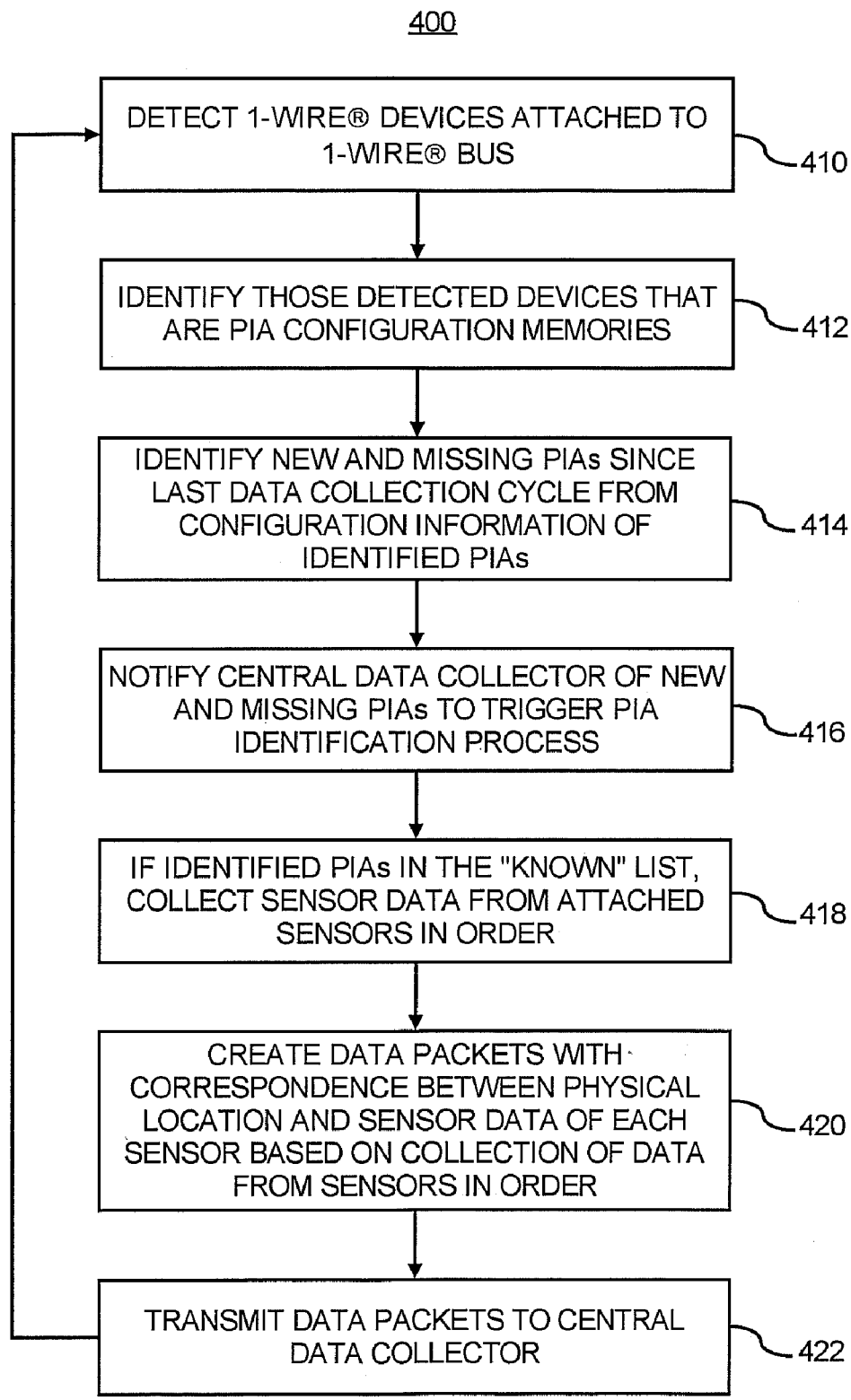
FIG. 4 illustrates a method for discovering and reading data from devices in a network, according to one embodiment.

FIG. 4 illustrates a method or process 400 that is periodically performed by each base station in each data collection cycle to discover sensor devices and automatically configure such devices to read in sensor data, in accordance with one embodiment. For illustrative purposes only and not to be limiting thereof, the method 400 is described in the context of the data center 100 and the sensor network diagram 200. Also, for simplicity purposes, the method 400 is discussion with reference to only one base station 132a, the sensor bus 210a which is a 1-Wire® bus to which the base station 132a is connected, and PIAs 130 that are connected to the 1-Wire® bus 210a and read by the base station 132a. However, it should be understood that such a discussion is applicable to all base stations 132a-n.

At 410, the base station begins each data collection cycle with a discovery process, wherein it periodically, for example, every t seconds (or some desired time), detects those 1-Wire® devices 130 that are attached to the 1-Wire® bus to which the base station is connected. In one embodiment, the base station executes the 1-Wire® "search ROM" algorithm (stored on a CRM of the base station and executed by its microcontroller) to look for a 1-Wire® memory device, such as the configuration memory on a PIA (based on the family code in the unique 1-Wire® address), to build a first list of those 1-Wire® devices attached to 1-Wire® bus.

At 412 the base station 132a proceeds to identify the type of each detected 1-Wire® device by comparing its 1-Wire® family code to a list of valid PIA configuration memory device 1-Wire® family codes. If the device is a valid PIA configuration memory device its 64 bit 1-Wire® address is stored in a list of currently connected PIA configuration memories (which is cleared each cycle).

At 414, the base station identifies any new and missing PIAs on the 1-Wire® bus by comparing the unique 1-Wire® address of each identified PIA configuration memory 130 (as identified in step 412) with a list of PIA configuration memory 1-Wire® addresses of those PIAs that were connected to the 1-Wire® bus 210a in the last data collection cycle. If an identified PIA configuration 1-Wire® address is not found on the list, its associated or corresponding PIA is considered new. If the list includes a PIA configuration 1-Wire® memory address that is not identified in this data collection cycle, a previously-installed PIA corresponding with such a PIA memory address is considered missing.

At 416, if there are new or missing PIAs, a PIA identification process is triggered at the base station 132a to ensure that a central data collector, such as the computing device 128, is aware of the change in the base station configuration. For example, if a new PIA is identified, the base station 132a may proceed to read into its memory buffer the contents of the PIA configuration memory and pass such contents on to the central data collector. However, this information may then be discarded by the base station 132a. In turn, the computing device 128 may notify the user or operator of the data center of the configuration change in the sensor network 200 of the data center 100. This information allows the central data collector to properly receive and use data collected from the currently installed set of PIAs attached to the base station.

At 418, for each identified PIA (including newly added ones) that are connected to the 1-Wire® bus 210a in the present data collection cycle, the base station 132a reads the contents of the PIA configuration memory into its memory buffer and verifies that they are in a known list of PIA types that may be read by the base station 132a. The contents of the PIA configuration memory provide information used by the base station 132a to identify or determine a second list of those attached 1-Wire® devices that are associated with the PIA. (e.g., temperature sensors, humidity sensors, actuator control devices.) and their physical order. The base station proceeds to read data from PIA devices (e.g., sensors) 230 that are attached to the identified PIAs. For example, if the base station is operable to only read PIAs with sensors thereon, any newly added PIAs having actuators thereon will not be read by the base station 132a and an error code may be generated by the base station 132a and forwarded to the central data collector. In one example, the base station 132a associates the PIA_Type field with the data collected from installed 1-Wire® devices. The PIA_Type information is passed to the central data collector along with data collected from sensors and/or actuators. The PIA_Type filed values are associated with specific PIA functions and installation locations, and its value allows the Central Data Collector to make correct assumptions about received data. For example, PIAs for placement in the front of the rack are provided with a PIA_Type code different from that provided for PIAs to be placed in the back of the rack.

At 420, as noted earlier, due to the programming of the configuration memory in the PIA 130, the base station 132a reads data from the PIA devices 230 in the same order as the physical order of such PIA devices on the PIA 130 so as to associate the device data with its location on the rack. This association and other data stored in the PIA configuration memory allows the base station 132a to create a data packet that includes the read device data (e.g., sensor data) and properly identified correspondence between the physical location of the PIA device and its read data.

At 422, the base station 132a forwards the data packet to the central data collector.

Accordingly, the systems and methods as described herein provide automatic configuration of plug-in assemblies, such as plug-in sensor assemblies via configuration information directly stored on such assemblies. This provides the plug-in assemblies and devices such as sensors thereon with "hot" plug-and-play capabilities for either connection or removal from a data network, such as a sensor network, without the need to deactivate such a data network to manually change the network configuration to accommodate the devices on such plug-in assemblies.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A method for automatic configuration of devices in a network having a network bus for communicating with the devices, wherein the network is implemented in a physical environment the method comprising:

detecting a device assembly that is connected to the network bus, wherein the device assembly includes a plurality of devices assembled thereon in a predetermined physical order;

upon detecting a device assembly connected to the network bus, determining whether the detected device assembly is of a predetermined first type;

upon determining that the detected device assembly is of the first type, reading data from the plurality of devices assembled thereon in an order corresponding to the predetermined physical order of the plurality of devices as assembled on the device assembly;

identifying a physical location in the physical environment of each of the plurality of devices on the first-type device assembly based on the order in which data of the plurality of devices is read from the first-type device assembly; and storing the identified physical locations of the plurality of devices in a configuration memory, wherein the physical locations of the plurality of devices are not stored in a memory prior to the reading of the data in the predetermined physical order from the plurality of devices.

2. The method of claim 1, wherein:

determining whether the detected device assembly is of a predetermined first type comprises reading a unique identification of the detected device assembly to determine whether the detected device assembly is of the predetermined first type;

upon determining that the detected device assembly is of the first type, identifying whether the first-type device assembly is newly connected to the network bus based on the unique identification of the first-type device assembly; and upon identifying the first-type device assembly as newly connected to the network bus, providing notification of a change in a configuration of the network to include the first-type device assembly.

3. The method of claim 2, wherein:

reading the unique identification of the first-type device assembly comprises reading the unique identification of the first-type device assembly in a present data collection cycle; and identifying whether the first-type device assembly is newly connected comprises comparing the unique identification of the first-type device assembly with a list of first-type device assemblies that were detected to be connected to the network bus in a last data collection cycle.

4. The method of claim 1, wherein:

detecting a device assembly that is connected to the network bus comprises building a first list of device assemblies that are connected to the network bus; and determining whether the detected device assembly is of the predetermined first type comprises determining whether one of the device assemblies in the first list is of the predetermined first type to form a second list of first-type device assemblies in a present data collection cycle.

5. The method of claim 4, further comprising:

comparing the second list of first-type device assemblies with a list of first-type device assemblies that were detected to be connected to the network bus in a last data collection cycle to determine whether there is a missing device assembly in the present data collection cycle.

6. The method of claim 1, wherein the detected device assembly is a plug-in assembly that is modularly removable and connectable to the network bus of the network.

7. The method of claim 6, wherein the plurality of devices assembled on the detected device assembly include at least one of a sensor device for sensing an environmental condition of the physical environment and an actuator device for adjusting the environmental condition of the physical environment.

8. The method of claim 1, wherein the physical environment is a data center, and the network is a sensor network in the data center for sensing at least one environmental condition in the data center.

9. The method of claim 8, wherein the plurality of devices on the first-type device assembly include a plurality of sensor devices for sensing the at least one environmental condition in the data center.

10. The method of claim 9, further comprising:

mounting the first-type device assembly on an equipment rack in the data center to detect the at least one environment condition in the data center; and wherein identifying a physical location in the physical environment of each of the plurality of devices on the first-type device assembly comprises identifying a physical location on the equipment rack of each of the plurality of sensor devices on the first-type device assembly based on the order in which sensed data of the sensor devices is read from the first-type device assembly.

11. The method of claim 6, wherein the network bus is a two-conductor bus, and the plug-in device assembly is a device having a two-conductor interface.

12. A sensor network in a physical environment comprising:

a data collector;

a plurality of base stations;

a plurality of data buses connected to the plurality of base stations; and a plurality of plug-in assemblies (PIAs) that are modularly connectable and removable from the plurality of data buses, each of the plurality of PIAs includes a plurality of sensor devices assembled thereon in a predetermined physical pattern, wherein the plurality of plug-in assemblies are located at different locations throughout the physical environment;

wherein a first base station of the plurality of base stations operates to communicate with a first PIA of the plurality of PIAs via one of the plurality of data buses to read sensed data of the plurality of sensor devices on the first PIA in an order corresponding to a predetermined physical order of the plurality of sensor devices on the first PIA and to associate the sensed data with a physical location in the physical environment of each of the plurality of sensor devices based at least on a reading order of the sensed data from the plurality of sensor devices in view of the predetermined physical pattern of the plurality of sensor devices, and wherein the first base station also operates to store the identified physical locations of the plurality of sensor devices in a configuration memory, wherein the physical locations of the plurality of devices is not stored in a memory prior to the data being read in the predetermined physical order from the plurality of sensor devices.

13. The sensor network of claim 12, wherein at least one of the plurality data buses is a two-conductor interface bus.

14. The sensor network of claim 12, wherein the association of the sensed data with the physical location in the physical environment is further based on the location of the first PIA.

15. The sensor network of claim 12, wherein the physical environment is a data center having a plurality of equipment racks, and the plurality of plug-in assemblies are located in the plurality of equipment racks.

16. The sensor network of claim 15, wherein each of the plurality of PIAs further includes a configuration memory that stores the sensed data of the plurality of sensor devices in a predetermined order for reading the sensed data, wherein the predetermined order corresponds with the predetermined physical pattern of the plurality of sensor devices assembling on the first PIA.

17. The sensor network of claim 16, wherein the first PIA and a second PIA of the plurality of PIAs are both connected to a first rack of the plurality of equipment racks, and locations of the first and second PIAs on the first rack are identified from data permanently stored in the configuration memories of the first and second PIAs.

18. The sensor network of claim 16, wherein the configuration memory in each of the plurality of PIAs includes unique information to identify each PIA.

19. The sensor network of claim 18, wherein the plurality of base stations operate to access the unique identification information of the plurality of PIAs and provide the accessed information to the data collector to provide automatic configuration of the sensor network upon an addition of a new PIA to the sensor network or a removal of one of the plurality of PIAs from the sensor network so as to identify physical locations in the data center of the plurality of sensor devices assembled on the PIAs that remain in the sensor network.

20. A computer-readable medium on which is embedded computer-executable program code executed by a processing element to:

detecting a device assembly that is connected to a network bus in a network, wherein the device assembly includes a plurality of devices assembled thereon in a predetermined physical order;

upon detecting a device assembly connected to the network bus, determining whether the detected device assembly is of a predetermined first type;

upon determining that the detected device assembly is of the first type, reading data from the plurality of devices assembled thereon in an order corresponding to the predetermined physical order of the plurality of devices as assembled on the device assembly;

identifying a physical location in the physical environment of each of the plurality of devices on the first-type device assembly based on the order in which data of the plurality of devices is read from the first-type device assembly; and storing the identified physical locations of the plurality of devices in a configuration memory, wherein the physical locations the plurality of devices are not stored in a memory prior to the reading of the data in the predetermined physical order from the plurality of devices.

* * * * *